United States Patent
Kangas

(10) Patent No.: US 6,563,440 B1
(45) Date of Patent: May 13, 2003

(54) APPARATUS AND METHOD FOR DECODING HUFFMAN CODES USING LEADING ONE/ZERO STRING LENGTH DETECTION

(75) Inventor: Janne Kangas, Oulu (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/045,693

(22) Filed: Oct. 19, 2001

(51) Int. Cl.[7] .................................................. H03M 7/40
(52) U.S. Cl. ........................................................ 341/65
(58) Field of Search ............................. 341/67, 65, 63, 341/59

(56) References Cited

U.S. PATENT DOCUMENTS

| | | | |
|---|---|---|---|
| 5,181,031 A | 1/1993 | Tong et al. | 341/65 |
| 5,208,593 A | 5/1993 | Tong et al. | 341/65 |
| 6,219,457 B1 * | 4/2001 | Potu | 341/67 |

* cited by examiner

*Primary Examiner*—Brian Young
(74) *Attorney, Agent, or Firm*—Cohen, Pontani, Lieberman & Pavane

(57) ABSTRACT

Decoding Huffman codes is accomplished by identifying consecutive strings of high order ones or zeroes and following consecutive strings of high order ones or zeroes, retrieving a table entry for each string based on its run count and bit value, until the retrieved entry contains the decoding output symbol, or until the remaining bits of the code word number within a predetermined threshold. The remaining bits are used as an offset into a lookup table, but the dimensions of the table have been reduced through elimination of the leading ones and zeroes. The consecutive strings are preferably processed by a hardware accelerator to identify the repeated bit, count the bits in the string and return this information to the host processor. The efficiencies of decoding canonical codes are realized; yet, non-canonical codes can be decoded.

30 Claims, 4 Drawing Sheets

APPARATUS AND METHOD FOR DECODING HUFFMAN CODES USING LEADING ONE/ZERO STRING LENGTH DETECTION

BACKGROUND OF THE INVENTION

1. Field of the Invention

This invention relates to data compression, and specifically to decoding Huffman-encoded code words.

2. Description of the Related Art

Huffman codes are very widely used in the area of data compression and telecommunication. Some applications include JPEG picture compression and MPEG video and audio compression. Huffman codes are of variable word length, which means that the individual symbols used to compose a message arc represented (encoded) each by a distinct bit sequence of distinct length. This characteristic of the code words helps to decrease the amount of redundancy in message data, i.e., it makes data compression possible. For example, symbols A, B, C and D may be represented with following code words:

TABLE 1

An example of Huffman code table

| Symbol | Code word |
| --- | --- |
| A | 0 |
| B | 10 |
| C | 110 |
| D | 110 |

All code words are uniquely decodable; for example, the sequence of bits "01101110100" decodes to "ACDABA". The set of code words is called a symbol list or alphabet. Uniqueness follows From the "prefix property" of Huffman codes; that is, the fact that if and when any leftmost or "leading" substring of a code word matches a code word in a Huffman decoding table, there is no need to check any additional bits beyond the leading substring. For example, the symbol "B" is assigned a code word of "10". Thus, no other code words begin with "10".

The use of Huffman codes affords compression, because distinct symbols have distinct probabilities of incidence. This property is used to advantage by tailoring the code lengths corresponding to those symbols in accordance with their respective probabilities of occurrence. Symbols with higher probabilities of incidence are coded with shorter code words, while symbols with lower probabilities are coded with longer code words. Longer code words still show up, but because of their smaller probabilities of occurrence, the overall code length of all code words in a typical bit string tends to be smaller due to the Huffman coding.

The algorithm for building Huffman code is based on a "coding tree". Commonly-known algorithm steps are:

1. Line up the symbols by decreasing probabilities.
2. Link two symbols with least probabilities into one new symbol which probability is a sum of probabilities of two symbols.
3. Iterate step two until there is only one symbol left that has probability of unity.
4. Trace the coding tree from a root (the generated symbol with probability 1.0) to origin symbols, and assign to each lower branch 1, and to each upper branch 0, or vice versa.

For example, probabilities for some letters are listed in Table 2, and one of the possible Huffman trees built by applying the above algorithm to these probabilities is shown in FIG. 1.

TABLE 2

Example of a probability distribution in a subset of an alphabet

| E | 2/25 |
| --- | --- |
| X | 1/25 |
| A | 2/25 |
| M | 2/25 |
| P | 1/25 |
| L | 1/25 |
| O | 2/25 |
| F | 2/25 |
| H | 1/25 |
| U | 1/25 |
| C | 1/25 |
| D | 1/25 |
| I | 1/25 |
| N | 2/25 |
| G | 1/25 |
| space | 3/25 |

Each "0" bit in a code word corresponds to traversing a "0" branch in the tree, which, in FIG. 1, is done by going up; going down traverses a "1" branch. The code word "11000" is represented on the tree by, starting on the right, at the root, and traversing one-by-one, a branch for each bit of the code word. The first two bits, "11", correspond to the two one branches, or two down steps. The next bit, "0", corresponds to movement up, i.e. along a zero branch, as shown by the arrow. Traversing two more zero branches, for the remaining bits, "00", leads to the output symbol for the complete code word "11000", which is here the letter "P", located on the left side of FIG. 1.

It is thus seen from FIG. 1 that, for example, the code for letter "P" is "11000" and that there are several possible Huffman tables for any given probability distribution.

A basic difficulty in decoding Huffman codes is that the decoder cannot know a prior what is the length of an incoming code word.

Huffman codes can be detected extremely fast by dedicating enormous amounts of memory. For a set of Huffman code words whose maximum word length of N bits, $2^N$ memory locations are needed, because N incoming bits are used as an address into the lookup table to find the corresponding code words. For example, the decoding symbols of Table 1 would require $2^3=8$ memory locations. All addresses that begin with "0" are used to store the symbol "A", all addresses starting with "10"store the symbol "B" and so forth. When a code word is applied to the lookup table, decoding of the slice is performed instantly. Then, the incoming bit stream is shifted by the bit length of the code word just decoded, to bring the following code word into operable decoding position. For codes that have, for example, a maximum length of 19 bits, memory requirements grow very large.

A technique requiring less memory is bit-by-bit decoding, which proceeds as follows. One bit is taken and compared to all the possible codes with a word length of one. If a match is not found, another bit is shifted in to try to find the bit pair from among all the code words with a word length of two. This is continued until a match is found. Although this approach is very memory-efficient, it is also very slow, especially if the code word being decoded is long.

Another solution uses content-addressable memories (CAMs). A bit slice (i.e., bit string long enough to accommodate any code word and therefore equal in length to the maximum code word) is applied to the input of a CAM containing, all code words as "addresses" and memory pointers as "contents". The CAM contains memory pointers that reference symbols and associated code word lengths in a RAM table. Once a code word is decoded, the incoming bit stream is then shifted by the length of the decoded code word, and decoding resumes. An efficiently-implemented CAM scheme is fast, but still requires extra memory for pointers. Moreover, CAMs are not readily available in all technologies. The CAM-based approach is described in U.S. Pat. No. 5,208,593 which is further discussed below.

As indicated in the above examples, a problem in using variable code word lengths is achieving balance between speed and reasonable memory usage.

Canonical Huffman codes are of special interest since they make decoding easier. PKZip (file compression/decompression utility), MPEG-1 layer III (Mp3) and the JPEG default baseline encoder all use canonical Huffman tables. Applications can also be found in other areas of multimedia and telecommunication.

Characteristic of canonical Huffman codes is that the most significant (n−1) bits of the smallest Huffman code of length n are greater in value than the largest Huffman code of length (n−1), provided that the table is of the type where almost all codes have a leading one bit. For a Huffman table composed predominantly of codes whose leading bit is zero, that is, a table derived, for example, by reversing all code word bits, a converse rule applies: The most significant (n−1) bits of the largest Huffman code of length n are smaller in value than the smallest Huffman code of length (n−1). Transforming Huffman tables to canonical format does not decrease coding efficiency, because, as can be seen from the following example in Table 3, the transformation does not change the number of bits per code word.

TABLE 3

Normal versus canonical code words

| | tree code | code2 | code3 | canonical |
|---|---|---|---|---|
| A | 001 | 111 | 100 | 010 |
| D | 0000 | 1101 | 0011 | 0000 |
| C | 1001 | 0010 | 1011 | 0001 |
| D | 101 | 000 | 000 | 011 |
| E | 01 | 01 | 11 | 10 |
| F | 0001 | 1100 | 1010 | 0010 |
| G | 1000 | 0011 | 0010 | 0011 |
| H | 11 | 10 | 01 | 11 |

In accordance with the above converse rule for canonical codes, codes of length 3 (for example, 010 and 011) are always larger than the three starting bits of codes of length 4 (for example, 0000,0001,0010,0011). Code lengths are otherwise left unchanged.

Also noteworthy is that canonical codes often start with a string of ones (or zeroes) due to the above characteristic. The property of starting with one strings has been used in U.S. Pat. No. 5,208,593 ("Tong") in the context of JPEG decoding, since JPEG Huffman tables consist of several codes that start with strings of ones. This reference applies "leading ones detection" to Huffman codes used in JPEG. The next code word to be decoded is checked for the length of the consecutive run of "1"s that starts at the most significant bit (MSB) (hereinafter, "the leading bit" will mean the most significant bit or leftmost bit) of that next code word. After this length or count is known, it is also known, based on a given maximum code word length, what is the maximum number of remaining bits in the code word. The consecutive run of ones (and the following zero, since it is always known) arc masked away. The remaining bits, plus the knowledge of the number of consecutive (leading) ones, are used to form an address into a RAM table which contains symbols.

Tong is only effective on Huffman code words that have a leading bit string of ones. The Mp3 Audio Standard, for example, specifies Huffman tables with codes word with leading strings of zeros. Moreover, Tong is operative only on canonical Huffman tables and uses a lot of memory. If Tong's methodology were to be applied to the Huffman table shown below in Table 4 (Hashemian, R. Memory Efficient and High-Speed Search Huffman Coding, IEEE Transactions on Communications, Vol. 43 No. 10, (1995)), Tong would do particularly well, because it is a single-side crowing table, i.e., a table constructed to keep "subtrees" small. Tong, however, uses 13 words for addresses into a second table which contains 36 entries, requiring, in total, 13+36=49 words. In addition, Tong would be memory-inefficient if applied to JPEG standard AC tables that have maximum code word lengths of 8 bits after the elimination of leading ones because Tong would use $2^8$ memory locations in a lookup table for those remaining 8 bits.

U.S. Pat. No. 6,219,457 to Potu discloses Huffman decoding pre-processing that is implemented to count either the number of consecutive leading zeros of a code word or the number of leading ones of a code word, depending, respectively, on whether the incoming code stream has been encoded under the MPEG standard, which codes with leading zeros, or under the IPEG or Digital Video Standard, which code with leading ones. The count is used to index into a first lookup table to determine a base address of a variable length code (VLC) decoding table. A predetermined number of bits following the counted bits in the code word are combined with the base address to select the proper VLC decoding table, from which the output symbol is retrieved.

Potu, however, operates only on either a leading one bit string or on a leading zero bit stream, depending on the application to which Potu is being applied; moreover, Potu is not effective on successive bit runs within the same code word. As in the case of Tong, Potu can handle Huffman codes only if they are canonical, and Potu's inability to decode successive bit runs in the same code word leads to larger decoding tables.

TABLE 4

Huffman table From Hashemian's work.

| CL | Symbols | Huffman | Code |
|---|---|---|---|
| 2 | 00 | 00 | |
| 2 | 01 | 01 | |
| 4 | 02 | 1000 | |
| 4 | 03 | 1001 | |
| 4 | 04 | 1010 | |
| 4 | 05 | 1011 | |
| 4 | 06 | 1100 | |
| 4 | 07 | 1101 | |
| 5 | 08 | 1110 | 0 |
| 6 | 09 | 1110 | 10 |
| 6 | 0a | 1110 | 11 |
| 6 | 0b | 1111 | 00 |
| 7 | 0c | 1111 | 010 |
| 7 | 0d | 1111 | 011 |
| 8 | 0e | 1111 | 1000 |
| 8 | 0f | 1111 | 1001 |
| 8 | 10 | 1111 | 1010 |
| 8 | 11 | 1111 | 1011 |
| 8 | 12 | 1111 | 1100 |
| 9 | 13 | 1111 | 1101 0 |
| 9 | 14 | 1111 | 1101 1 |

TABLE 4-continued

Huffman table From Hashemian's work.

| CL | Symbols | Huffman | Code |   |
|----|---------|---------|------|---|
| 9  | 15      | 1111    | 1110 | 0 |
| 10 | 16      | 1111    | 1110 | 10 |
| 10 | 17      | 1111    | 1110 | 11 |
| 10 | 18      | 1111    | 1111 | 00 |
| 10 | 19      | 1111    | 1111 | 01 |
| 10 | 1a      | 1111    | 1111 | 10 |
| 12 | 1b      | 1111    | 1111 | 1100 |
| 12 | 1c      | 1111    | 1111 | 1101 |
| 12 | 1d      | 1111    | 1111 | 1110 |
| 13 | 1e      | 1111    | 1111 | 1111 0 |
| 13 | 1f      | 1111    | 1111 | 1111 1 |

Hashemian's decoding scheme is based on "clustering" the incoming bits as follows. The first L bits are "clustered" for use as a pointer into a table. If the code is L or fewer bits in length, the current table contains the symbol, and the code is instantly decoded. If it is longer, the table has pointers to other tables which contain code words that start with those particular L bits. These new tables are again addressed by the next L-bit cluster, and so forth, until the symbol is finally found. Decreasing L improves memory efficiency, but the number of decoding steps increases.

For example, for L=4, a 13-bit word requires four steps ($13/4=3.25$) to locate a symbol. The first four of the 13 bits identify, in the first lookup table, the pointer to a second lookup table, whose codes all start with those four bits. Those four bit are thus no longer needed. Therefore, there are 9 bits left for the second lookup; after the second lookup, there are 5 bits left for the third lookup; and after the third lookup, there is 1 bit left, which requires a fourth step. That is, the three table lookups constitute the first three steps in decoding, and the processing of the remaining bit constitutes the fourth decoding step. JPEG uses maximum lengths of 13 bits, while the longest code words in Mp3 are 19 bits long.

There are several drawbacks to Hashemian's scheme. It relies on bit masking and comparison steps. Also, since it does not exploit properties of canonical codes, the algorithm cannot simply jump over consecutive ones or zeros but processes code at a rate of at most L bits at a time; therefore, long codes take a very long time to decode. Moreover, Hashemian's solution using the above single-side growing table and a cluster length of 4 takes up 122 words of memory.

What is needed is a fast and memory-efficient decoding method flexible enough to handle Huffman codes whether or not they are canonical, yet sufficiently robust to take advantage of efficiencies realizable from decoding codes in canonical form.

Further aggravating the problem is the fact that general CPUs are not well equipped to handle code words of variable length but operate on native lengths such as 16 or 32 bits. Shifting and masking of bit fields with arbitrary masks and searching based on results is slow. Also, Huffman decoding algorithms are structured to require frequent comparisons and branches based on their results, which is very inefficient for CPUs with deep pipelines. Some digital signal processors (DSPs) are very capable at bit field manipulation, but unfortunately also have long pipelines. Large if/then or switch/case-structures should be avoided.

Pure software decoding is slow. Finding the first 1" in a stream, for example, requires several comparison operations using two's exponents or, alternatively, other complex tasks. In hardware, finding the leading one is a simple task which requires only combination logic, whereas, with general CPU instructions, several shift/mask/comparison operations are needed.

Performing Huffman decoding requires the use of specialized independent hardware components such as shifters and adders, etc. This approach is feasible in application-specific devices, such as high definition television (HDTV) decoders, etc., but is a waste of resources on a system with a high-performance processor since these components already exist in the host.

An accelerator can be implemented as a completely independent decoder (loose coupling) that has its own access to memory and outputs data so that the host CPU can perform its own tasks. Although several resources must be duplicated (adders, memory interface units, shifters etc.), performance is high. Unfortunately, Huffman decoding requires rather large tables which, if stored in the decoder's internal memory, would require that the memory be correspondingly large and costly. If the tables are in common memory, the decoder might block memory buses since decoding is a memory-intensive application.

SUMMARY OF THE INVENTION

In one aspect, the present invention is directed to a method, apparatus and program for decoding a current code word in a series of Huffman-encoded code words. The value of a bit in the code words is detected. A current count is calculated of that bit and subsequent, consecutive bits of the same value. Based on the current count, an entry is retrieved from the decoding table. The detecting and calculating is iteratively repeated, each time for bits subsequent to those already counted, until the last retrieved entry indicates that no more iterations are to be pet formed.

In a further aspect of the invention, if the last retrieved entry does not contain an output symbol that constitutes a decoding of the current code word, at least one bit subsequent to those counted is used to retrieve an entry that contains an output symbol that constitutes a decoding of the current code word.

In another aspect, the present invention is directed to determining the value of the leading bit of a string, and a count of a run that includes the bit. A value detector detects the value, and, a first inverter inverts the bits of the string if the detected value is equal to a pre-selected bit value. A digit extender converts to the pre-selected bit value every bit of the string of value different than the pre-selected bit value and of significance lower than that of the most significant bit having the pre-selected bit value. A second inverter inverts bits output from the digit extender. A reversor reverses the order of the bits inverted by the second inverter to create a reversed string. A thermometer code evaluator calculates a run count of the bits in the reversed string that hive the pre-selected value.

In an alternative aspect, this invention is directed to a computer usable medium having computer-readable program code means for decoding Huffman codes. The means includes a Huffman decoding table having, as an entry, an offset for identifying, from serially-arranged Huffman-encoded code words, remainder bits that represent a tail offset into the table. The number of remainder bits representing the tail offset is predetermined based on a plurality of counts of respective, consecutive, same-valued hits in the serial arrangement. The same-valued bits are of significance higher than that of the remainder bits and generally do not all have the same bit value count-to-count.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

DETAILED DESCRIPTION OF THE PRESENTLY PREFERRED EMBODIMENTS

This invention provides a fast and memory-efficient way of decoding a Huffman code stream. Decoding is based on the detection of bit runs, i.e., "10000 . . . " and "1111 . . ."-strings, in the beginning of the code word. After the length of first n bits of consecutive ones or zeros is found, the remaining bits in the code word (forward from the n+1 position) are again searched for continuous streams of ones or zeros, until it can be decided that there are only a few bits left in the code word, at which point, they can be used to look up the corresponding symbol from a memory table. This process can be visualized as travelling maximum lengths of "straight runs" at in a Huffman tree and stopping every time that a "turn" leading to new "subtree" is detected. Advantageously, a code word is processed at a minimum of two bits at a time (leading zero or one and the following bit that indicated "turn").

Figure 1:
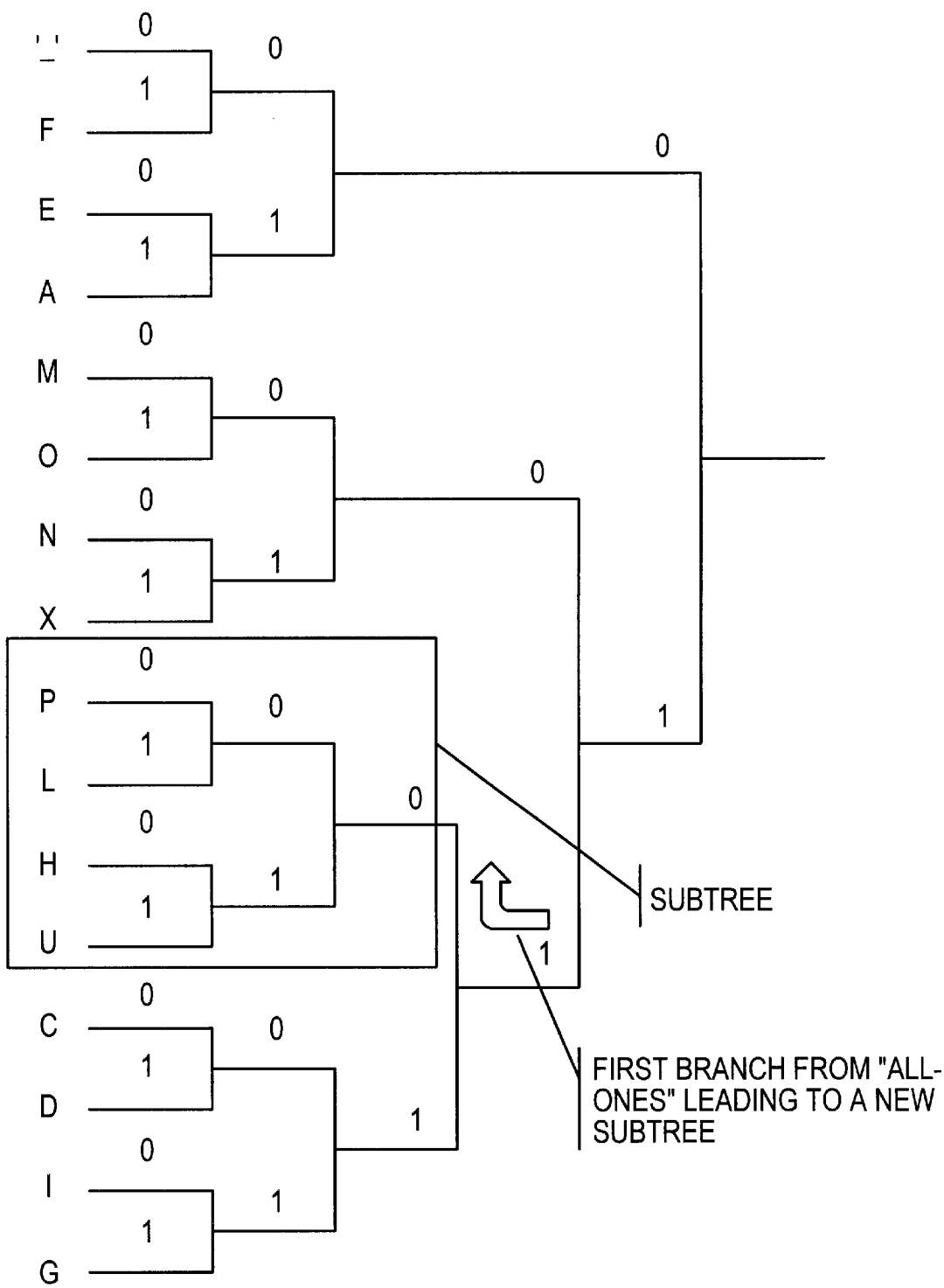
FIG. 1 is a diagram of a Huffman tree.

For example, in FIG. 1, the decoding process for letter "P→11000" would roughly proceed as follows: first, the deviation from all ones/zeros path, meaning that a different branch in the tree has been reached, is detected. Following this, the first 2+1 bits ("110") which are no longer needed, are eliminated and "00XXXXX . . . " remains to be decoded. Here, the X's are bits that belong to the next code word. The trailing dots are less specific, and hereinafter refer to bits that follow, whether or not those following bits belong to a subsequent code word. Referring to FIG. 1, the ("110") string processed implies that we have gone down two "1" branches and up one "0" branch.

The remaining, bits "00XXXXX" are fed again to the leading one/zero -detector. In this case, the detector detects that we are heading in the "0000 . . . "-direction. Since, referring to FIG. 1, the maximum remaining code length in the all-zero direction is two (and in fact it is two in any direction), we have reached the end of route "11000", which has now been decoded.

By contrast, when faced with the remaining bits "00XXXXX", U.S. Pat. No. 5,208,593 (Tong) has already detected consecutive high order ones, and has no means by which to detect high order zeroes. Tong instead takes the remaining high order bits up to a "maximum remainder length" as a lookup key into a decoding table. The maximum remainder length can far exceed two and therefore requires a larger table than that required in accordance with the present invention.

Also, since the present inventive methodology processes a code word at a minimum of two bits at a time (from the leading bit to the bit of different value), the present invention quickly decodes even non-canonical Huffman-encoded code words, which characteristically do not have as many leading same-valued bit strings and which Tong's method could not handle without resorting to a large memory.

In contrast to Potu, the present invention does not rely on a second table lookup; instead, many output symbols are accessed on the first lookup. Also, like Tong, Potu requires larger table sizes than does the present invention, because only a single bit run count is pre-processed, and, like Tong, would need even larger table sizes to handle non-canonical Huffman codes.

Figure 2:
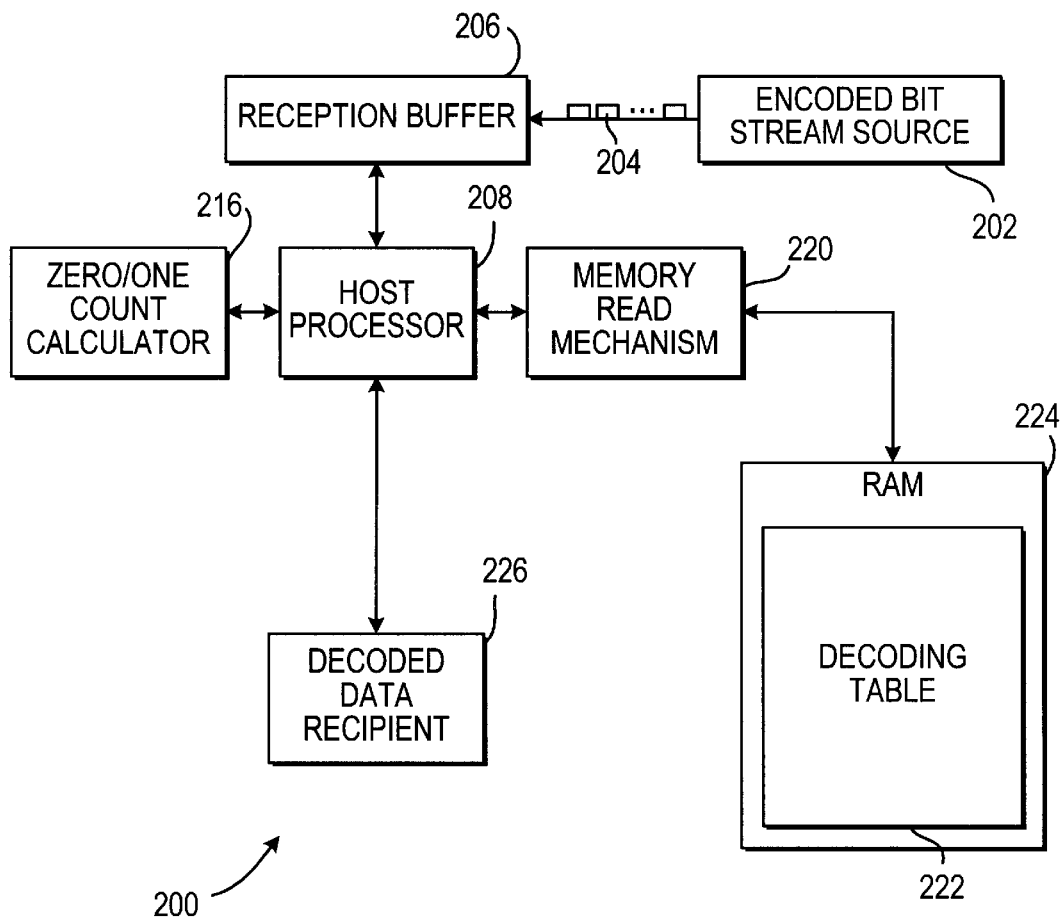
FIG. 2 is an exemplary decoding system in accordance with the present invention.

An exemplary decoding system 200, as shown in FIG. 2, includes an encoded bitstream source 202 for sending Huffman-encoded code words 204 for serial reception by a reception buffer 206. A host processor or control block 208, which may be a microprocessor, for example, receives the output of the buffer 206 and sends buffer control instructions to the buffer 206. The host processor 208 sends a group of bits in that output to a leading zero/one count calculator 216, which may be a hardware accelerator. The calculator 216 returns to the host processor 208 a count of consecutive, same-valued bits in the group. The host processor 208 determines an address based on the count and invokes a memory read mechanism 220 to read that address in a decoding table 222 that resides in a RAM 224 or other memory, such as a ROM. Based on the data read from that address, the host processor 208 decides (1) if another calculation is needed for another group, (2) if bits subsequent to those already counted are otherwise needed, or (3) if the read data includes an output symbol corresponding to a current code word so that the current code word has been decoded, i.e. an output symbol that constitutes a decoding of the current code word. In the first case, the host processor 208 invokes the leading zero/one count calculator 216 for another iteration. In the third case, the current code word is outputted to a decoded data recipient 226, which may be, for example, a reception buffer for a reverse discrete cosine transform processor. In the second case, where bits subsequent to those already counted are needed, the host processor 208 selects a predetermined number of them as a string whose value serves as a "tail offset" from the current location in the table 222 to decode the current word. The offset is referred to herein as a "tail offset", because the selected bits which provide it (hereinafter "the tail offset bits") arc located at the end of a code word to be decoded.

Figure 3:
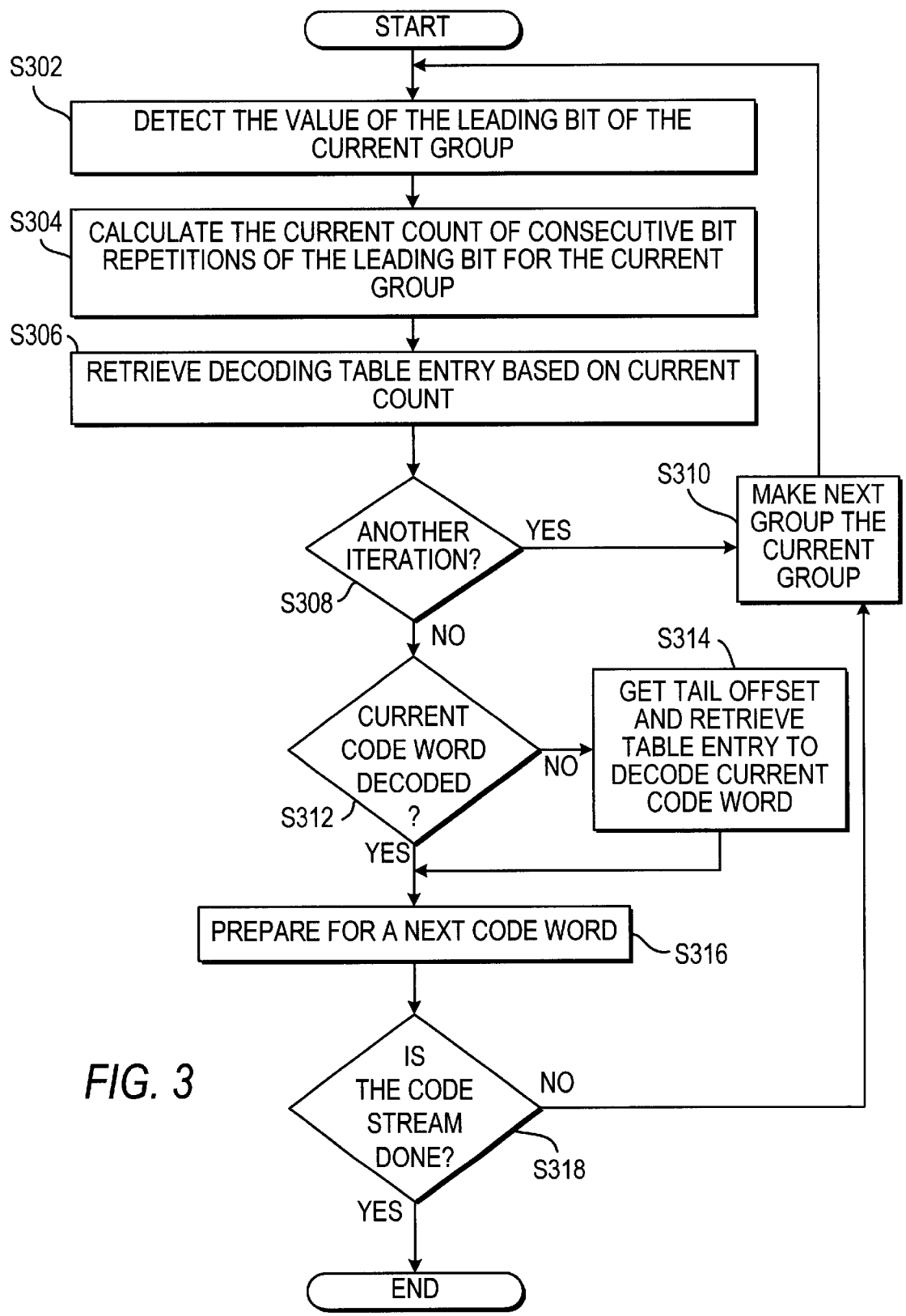
FIG. 3 is a flow chart of the process of decoding Huffman encoded code words in accordance with the present invention.

FIG. 3 is an exemplary flow chart that provides more detail on how decoding may be implemented according to the present invention. For illustration purposes, it is assumed that the reception buffer 206 contains the bit string "00011111010".

The process starts with the current group of bits and a current code word. At any particular point in the processing, the current group may extend, at its least significant end, far enough to include the current code word, or, it may be the case that the current code word is longer than the current group. In the present example, the length of a group is set at 8 bits, because the zero/one count calculator 216 has been configured with a search field length of 8 bits. The current group in the present example is therefore "00011111", and is transmitted to the calculator 216. The calculator 216 detects the value of the leading bit as "0"(step S302) and calculates, as the current count, the number of consecutive bit repetitions of the leading bit "0", i.e. the current count starts with the leading bit and includes subsequent, consecutive bits of the same value. The calculator 216 returns the current count, which is 3, to the host processor 208 (step S304).

The host processor 208 uses the current count, 3, as an offset into the decoding table 222 to point to an address of the table 222. The processor 208 provides the address to the memory read mechanism 220. The mechanism 220 retrieves the entry at that address, and provides the entry to the processor 208 (step S306). Based on the contents of that entry, the processor 208 decides if another iteration of counting consecutive bits is needed to decode the current code word (step S308). If so, as in the instant example, the next group is made the current group (step S310) and another iteration (steps S302 through S306) is carried out. In the instant example, that next group made the current group is "1111010X" where X represents the bit that comes next in the reception buffer 206, and is therefore retrieved by the processor 208. It is noted that, in determining that the current group is "1111010X", the preceding bit string "0001" was skipped. These four bits are no longer needed, because the three high order zeroes have already been counted, and the "1" bit is known from the fact that it is inherently the only bit that terminates a string of zeroes.

In the next iteration, after the leading bit has been detected (step S302) and the current count has been calculated (step S304), the processor 208 retrieves another entry from the decoding table 222 (step S306), or another decoding table branched to and swapped in to replace the table 222. Based on the newly retrieved entry, the processor 208 decides that another iteration is not needed (step S308) and that the entry last retrieved (step S306) does not contain an output symbol that constitutes a decoding of the current code word (step S312). In the present example, this is the second iteration in the process of decoding the same current code word. Since the current code word has not been decoded (step S312), the tail offset bits are needed to decode the current code word. The processor 208 knows, from the entry last retrieved (step S306), that the tail offset is provided by two bits, and retrieves the next two bits (step S314), which can be seen to be "10" in the instant example. The maximum length in bits of the tail offset bits is referred to hereinafter as the "tail threshold", which in the instant example is 2. The processor 208 uses the tail offset to point past its current location in the current decoding table and toward the location at which the output symbol resides and then extracts the output symbol (step S314). Since the bits just used to retrieve the output symbol are no longer needed, the processor 208 points past these bits in preparation for a next code word (step S316).

It is next decided whether decoding of the bit stream from the source 202 has been completed (step S318). If all bits received from the reception buffer 206 have been subject to decoding, processing stops and awaits restart if and when additional bits are received in the reception buffer 206. If, on the other hand, not all bits have been decoded, the processing loops back to the beginning for another iteration in which that next group is made the current group (step S310). Alternatively, completion of the decoding of the bit stream from the source 202 may be indicated by a special code word in the bit stream. In such an implementation, step S316 includes comparing the special code word to bits subsequent to those just decoded. If they match, processing is completed, and resumes with a signal that decoding is to be restarted. If, on the other hand, they do not match, processing loops back to step 310.

Thus, in the instant example, in decoding a code word, a run of zero bits is counted, a bit is skipped, and a run of one bits is counted. The final two bits of the code word provide a tail offset into the decoding table. The number of tail offset bits was restricted to a maximum of two bits, which maximum determined the number of iterations before the final iteration, which in this example was two.

Table 5 below is used in another example of decoding in accordance with the present invention, and uses an exemplary lookup table built based on the Huffman table labeled above as Table 4 and in accordance with the formatting discussed below.

TABLE 5

Example lookup-table

| Row # | Entry Identifier | Symbol/offset address | Shift amount/code length |
|---|---|---|---|
| −13 | S | 0x 1f | 13 |
| −12 | S | 0x 1e | 13 |
| −11 | S | 0x 1d | 12 |
| −10 | B | +31 | 15 |
| −9 | S | 0x 1a | 10 |
| −8 | B | +29 | 14 |
| −7 | B | +25 | 14 |
| −6 | B | +21 | 14 |
| −5 | B | +17 | 14 |
| −4 | B | +13 | 14 |
| −3 | B | +9 | 14 |
| −2 | B | +5 | 15 |
| −1 | B | +3 | 14 |
| 0 |  | 2 | 13 |
| 1 | S | 0x 01 | 2 |
| 2 | S | 0x 00 | 2 |
| 3 |  | 0x 02 | 4 |
| 4 |  | 0x 03 | 4 |
| 5 |  | 0x 04 | 4 |
| 6 |  | 0x 05 | 4 |
| 7 |  | 0x 06 | 4 |
| 8 |  | 0x 07 | 4 |
| 9 |  | 0x 08 | 5 |
| 10 |  | 0x 08 | 5 |
| 11 |  | 0x 09 | 6 |
| 12 |  | 0x 0a | 6 |
| 13 |  | 0x 0b | 6 |
| 14 |  | 0x 0b | 6 |
| 15 |  | 0x 0c | 7 |
| 16 |  | 0x 0d | 7 |
| 17 |  | 0x 0e | 8 |
| 18 |  | 0x 0f | 8 |
| 19 |  | 0x 10 | 8 |
| 20 |  | 0x 11 | 8 |
| 21 |  | 0x 12 | 8 |
| 22 |  | 0x 12 | 8 |
| 23 |  | 0x 13 | 9 |
| 24 |  | 0x 14 | 9 |
| 25 |  | 0x 15 | 9 |
| 26 |  | 0x 15 | 9 |
| 27 |  | 0x 16 | 10 |
| 28 |  | 0x 17 | 10 |
| 29 |  | 0x 18 | 10 |
| 30 |  | 0x 19 | 10 |
| 31 |  | 0x 1b | 12 |
| 32 |  | 0x 1c | 12 |

Table 5 (in this embodiment, only one table is needed, but a later embodiment shows a case that uses several tables) has 46 entries, i.e. rows, each consisting of a 16-bit word, a smaller space than that used in Tong (49 words) or Hashemian (122 words), as discussed previously. Considering that there are 32 possible codewords, efficiency here is $32/46 = 69.6\%$.

The rows of Table 5 are shown here for illustrative purposes as numbered by a "Row #" column, although the column does not actually exist in memory space when Table 5 is implemented as the decoding table 222, as shown in FIG. 2. In Table 5, row 0 has two fields, which in this example contain the values "2" and "13". These two fields are 8 bits each, for a total row length of 16 bits. Rows shown above row 0 are labeled with negative row numbers and rows show below row 0 are labeled with positive row numbers. All rows other than row 0 have three fields. The three fields, "Entry Identifier", "Symbol/offset address" and "Shift amount/code length" are 2, 10 and 4 bits, respectively, for a total row length of 16 bits.

The first field, entitled "Entry Identifier", holds information about three possible cases:

1) If the field contains "S" (a "symbol found indicator", represented in memory by, for example, two zero bits, denoted herein as "00"), the entry, i.e. row, contains the output symbol (i.e. decoding result) and its length.
2) If the field contains "B" ("branching indicator", represented by "01"), the entry holds an offset from the table starting address. The table starting address of Table 4 corresponds to the location of row 0. The offset is used to form an address that points to a memory entry that contains the output symbol and its length. That is, the offset is used to form an address that points to an entry having "S" as its "Entry Identifier", i.e. an "S" entry.
3) If the field contains "N" ("next table indicator", represented by "10"), the entry holds an offset from the table starting address that is used to point to a new table elsewhere in memory 224. Alternatively, the new table may be branched to and swapped in to replace the former table. (In the current example, and as evident from Table 5, there is no "N" entry, as explained immediately after this example.)

The second field, entitled "Symbol/offset address", can hold three different types of information:

1 ) The output symbol (here, one of 0x00 through 0x1f, which are hexadecimal numbers for 0 through 31, respectively), where the "0x" signifies that the symbol to follow is a hexadecimal number.
2) An offset from the table starting address. The offset is used in forming an address that points to the output symbol for the current code word.
3) An offset from the table starting address. The offset is used in forming an address that points to a new table starting address. (In the current example, as evident from Table 5, there is no entry pointing to a new table starting address.) The third field, entitled "Shift amount/code length", can hold two types of information.
1) It contains the amount that the current code word has to be shifted right to position the tail offset bits so as to form a valid address that points to the output symbol.
2) It contains the length of the current code word , the length by which the current code word is shifted, after an output symbol is found, to shift the current code word out and shift in a new code word.

A branch entry at the table starting address contains a positive branch count and a negative branch count, i.e., there are 2 possible branches on the all-zeros side (00 and 01) and 13 possible branches on the all-ones side. The positive and negative branch counts generally correspond to the maximum number of consecutive zero and one bits, respectively, in any code word for the current decoding table, although, as discussed below, the table can be configured with code words that exceed these limits.

If, for example, an incoming code stream contains 4 code words, "111111110 00 01 111011", and is received in the reception register 206:

1) The host processor 208 receives a current group CURR_GRP of 16 bits in a code word register, which is a non-circular, shift register. The accelerator 216 receives from the host processor 208 the current group CURR_GRP of 16 bits, which, in the current example, must contain the current code word, because the largest code word, as seen from Table 4, is 13 bits. CURR_GRP, which accordingly contains the current code word plus bits of the following code word(s), contains the following 16 bits: "1111111110 00 01 11".

Here, CURR_GRP contains the first three code words and part of the fourth code word. The first task is to decode the first code word, which at this point is the current code word.

2) Referring to FIG. 3, the accelerator 216 detects the leading bit of the group to be one (step S302) and returns the value −9. The magnitude nine means that it found the first zero after consecutive ones that occupy the highest nine bits in the group. The negative sign means that the value of the leading bit detected in step S302 is one. If the leading bit detected were zero, the value returned would have been positive. If ACC_VALUE is the return value, or current count that the calculator 216 returns, then for this example ACC_VALUE=−9 (step S304).
3) The host 208 checks if the value returned for ACC_VALUE is valid. If ZEROS MAX and ONES MAX represent the positive and negative branch counts, respectively, whether ZEROS_MAX OR ONES_MAX is selected for comparison to ACC_VALUE to validate ACC_VALUE depends on the sign of ACC_VALUE, i.e., ONES_MAX is used only when ACC_VALUE is negative, indicating a count of one bits. In the current example, since ACC_VALUE is negative, a check is made as to whether ONES_MAX←ACC_VALUE. Table 5 shows 13 as the contents of the negative branch count field in row 0. Although shown as unsigned to conserve storage, the negative branch count is always negative, since ONES_MAX represents the negative branch count and is compared to ACC_VALUE only when ACC_VALUE is negative. Therefore, the negative branch count, and thus ONES_MAX, in the current example are equal to −13. Since −13←−9, ONES_MAX←ACC_VALUE. ACC_VALUE is thus deemed valid.
4) The host reads the entry *(TABLE_STARTING_ADDRESS+ACC_VALUE), where TABLE_STARTING_ADDRESS refers to the table starting address, which is here located at row 0. That is, the table entry at row 0 +(-9) =-9, is:

| S | 0x 1a | 10 |
|---|---|---| and copies the entry into a retrieval register (step S306), which is a non circular, shift register, where *(ADDRESS) refers to the content of the memory location at ADDRESS. Referring to Table 5, the above table entry is located nine entries above TABLE_STARTING_ADDRESS, because ACC_VALUE=−9.

5) The host 208 checks whether the "Entry Identifier" field for this entry is S, B or N. To do this, the host processor 208 copies the contents of the retrieval register into a work register. The "Symbol/offset address" field is the second type of this second field in the table, as described earlier. The second type indicates that an output symbol can be found from the address indicated by the slum of the table starting address, the offset found from this field, and the tail offset. This second type of the "Symbol/offset address" field will be referred to hereinafter as "OFFSET". In the current example, the middle field in the above depiction of a retrieved table entry is the OFFSET, which is 10 bits long, and the rightmost field is the "Shift amount/code length" field, which is 4 bits long. These lengths are not invariable, and, as explained below are selected to accommodate other design parameters. The immediate goal is to determine the value in the leftmost field, the "Entry Identifier" field. Shifting the work register right by 14 bits acts to right justify the "Entry Identifier" field and fill the leftmost 14 bits with zeros. Each of the values "S", "B" and "N" reside in the rightmost part of their respective storage locations. Shifting the work register has therefore facilitated bit-to-bit comparison of the "Entry Identifier" in the work register to each of the respective storage locations, so that the "Entry Identifier" can be identified by comparison as one of the values S, B and N. The comparisons can be performed in any order, e.g., to N, to S and then to B. Optionally, comparisons are potentially done to only two of the three values, because the third value is determined by process of elimination.

6) The comparison of the shifted work register with the value "S" indicates that, in the current example, the "Entry Identifier" is "S", which indicates that another iteration is not needed (step S308), the current code word has been decoded (step S312), and that the retrieval register therefore holds the output symbol for the current code word.

7) To prepare for the next code word, the host 208 checks the "Shift amount/code length" entry, i.e. last 4 bits, of the retrieval register to find out the code length, CW_LEN, of the code word that was just decoded, which in the present example is 10.

8) The retrieval register is shifted left by two bits to clear the "Entry Identifier", which is two bits long, and then shifted right by six bits to clear the Shift amount/code length field (which is 4 bits long, but shifting right by 6 bits compensates for the two bit shift to the left) and right justify OFFSET, which contains the decoded output in the form of an output symbol. In the present example, the output symbol is "0x1a", as illustrated above in the retrieved entry. The output symbol has now been isolated and right justified in the retrieval register, and is therefore available for subsequent processing of the decoded output.

9) The host 208 prepares to decode a new code word by shifting the code word register left by the CW_LEN, which is 10 (step S316). In the current example, the bits "1111111110" are left-shifted out of the code word register. If new bits are available, they are inserted from the right. In the current example, "1011 . . . " is shifted in from the right. The trailing dots represent following bits, if they exist. The code word register therefore contains "00 01 111011 . . . ." Following bits would not exist if, for example, no other bits were available from the reception buffer 206, as when decoding of the code stream is done. If the code word register is non-empty (step S318), as it is in the instant case, decoding continues, and the next group is made the current group (step S310).

10) CURR_GRP, which in the present case consists of the first 10 bits, "00 01 111011" of the current group and any other following bits tip to the register limit of 16 bits is ready to be sent as a group of bits to the accelerator 216 to decode a new code word, which is now deemed the current code word.

11) The accelerator 216 receives CURR_GRP, which in the current example is "00 01 111011 . . . ", as indicated above in step (9).

12) The accelerator 216 returns ACC_VALUE=3 (that is, the current count equals 3) meaning that first "one" was found after three "zeroes".

13) The host 208 checks if ACC_VALUE=<ZEROS_MAX.

14) ZEROS_MAX, the leftmost field located at the TABLE_STARTING_ADDRESS (which is at row 0 of Table 5) is 2. Since ACC_VALUE is 3, it is not true that ACC_VALUE =<ZEROS_MAX, i.e., ACC_VALUE is "out of bounds." Therefore, ACC_VALUE is set to the value ZEROS_MAX, which in this case is 2.

15) The host 208 reads entry *(TABLE_STARTING_ADDRESS+ACC_VALUE), that is, the entry a row 0+2=2, pointing to entry:

| S | 0x 00 | 2 |
|---|-------|---| and the host 208 copies this entry into the retrieval register and the work register, as in steps 4 and 5 above.

16) The host 208 checks the "Entry Identifier" field, as in step 5 above, which at this point in this example contains "S", a therefore determines that the current code word has been decoded (steps S308 and S312).

17) The host 208 extracts the last 4 bits, as in step 7 above, to determine CW_LEN, which at this point in the example equals 2.

18) The host 208 deletes the two most significant bits to delete the "Entry Identifier" field and shifts the OFFSET (which is 4 bits long) right by 4+2=6 bits, as in step 8 above, to right-justify the output symbol, which at this point in the example is "0x00".

19) The code word register is shifted left by CW_LEN, as in step 9 above. At this point in the example, CW_LEN=2 bits. New bits are added to the right side of the code word register.

20) Now, CURR_GRP contains "01 1110 11 . . . ", because the two bits just decoded have been shifted out of the code word register in step 19 above.

21) The accelerator 216 detects the leading bit of the group to be 0 (step S302) and returns the value 1. Therefore, ACC_VALUE=I 22) ACC_VALUE is within bounds, because ACC_VALUE=<ZEROS_MAX, which is 2.

23) The host 208 checks *(TABLE_STARTING_ADDRESS+ACC_VALUE), that is, the entry at row 0+1=1 and receives:

| S | 0x 01 | 2 |
|---|-------|---| which is stored in the retrieval register and the work register

24) After it is shifted into the least significant end of the work register, as in steps 5 and 6 above, the "Entry Identifier" is determined by comparison to be "S".

25) The host 208 checks the last 4 bits of the retrieval register to receive the value 2 from the "Shift amount/code length" field.
26) The output symbol is "0x01" with length 2. The same procedure, as shown above, is performed to prepare for the next code word.
27) CURR_GRP="1110 11 . . . ."
28) ACC_VALUE=−3.
29) ACC_VALUE is within bounds because ONES_MAX=−13 and ONES_MAX <=ACC_VALUE.
30) The host 208 reads the table at *(TABLE_STARTING_ADDRESS+ACC_VALUE), that is, the entry at row 0 +(−3)=−3 and receives:

| B | +9 | 14 |
|---|----|----| which is stored into the retrieval register and the work register
31) After it is shifted into the least significant end of the work register, as in steps 5 and 6 above, the "Entry Identifier" is determined by comparison to be "B". For a "B" entry, another iteration is not needed (step S308), and the current code word has not yet been decoded (step S312).
32) The host 208 checks the last 4 bits of the retrieval register to receive the value 14 from the "Shift amount/code length" field. This value will be used to determine the number of bits a temporary register, referred to hereinafter as "TEMP", is shifted right in order to right justify the tail offset bits, so that the tail offset can be added, in step 35 below, to form an address that points to the output symbol.
33) At this point, the host 208 could shift the code word register left by one plus the magnitude of ACC_VALUE or |ACC_VALUE|+1=3+1=4 bits to shift out the already counted bit run and the trailing bit, which is inherently known. However, the code word register is not shifted here, because a "B" entry requires a tail offset, which adds bits to, and therefore, increases the length of the code word. Instead of shifting the used bits, at this point out, of the code word register, the entire current code word will be shifted out at once when decoding of the Current code word is completed and the code word length is retrieved. In the current example, the code word is shifted out in step 38.
The host 208 stores CURR_GRP into a temporary register, referred to hereinafter as "TEMP". Although the code word register was not shifted left by |ACC_VALUE|+1 bits, TEMP is shifted left by |ACC_VALUE|+1 bits. As a result, the bit string "1110" is eliminated. TEMP now contains "11 . . . ." (The leading two bits, "11", stored in TEMP comprise the tail offset bits which are needed in step 35, wherein TEMP is right-shifted by 14 so that the string "11" is right-justified).
34) The host 208 shifts the retrieval register to position OFFSET (i.e. bits 4 through 13, where bit 0 is the rightmost bit position of the register) at the least significant i.e. rightmost, end of the register and determines that OFFSET=+9.
35) The host 208 reads the table at the address *(TABLE_STARTING_ADDRESS+OFFSET+(TEMP right-shifted by 14)), that is, the address *(TABLE_STARTING_ADDRESS+9+3), i.e. row 0+9+3=row 12, and receives the entry:

| 0x 0a | 6 |
|-------|---| which is stored in the retrieval register (step S314—the 3 addend used above to determine the entry location at row 12 is the value of the tail offset bits "11").
36) The host 208 reads the last 4 bits of the entry to determine that CW_LEN=6.
37) The host 208 shifts the entry right by 4 bits to right-justify the symbol "0x0a".
38) The code word register is left-shifted by CW_LEN (step S316), and new bits are added from the right, if there arc new bits. In the current case, there are no new bits.
39) Since there arc no new bits available from the reception buffer 206 (step S318), processing halts until reactivated by the arrival of bits in the reception buffer 206.

The Table 5 lookup table does not have a Field Identifier i"N", because the Table 4 code words, upon which Table 5 is based, are such that the remaining part of any code word after a count, i.e., the part other than the bit run combined with the immediately following and inherently known bit, is always two or fewer bits in length. By design, therefore, these two or fewer bits are immediately evaluated as a predetermined tail offset into Table 5 in what is a first and final iteration. This first example, therefore, does not fully show the potential for recursive counting of zero and one string's in the instant invention.

An exemplary second embodiment of the invention demonstrates iteration in the search for leading ones and zeroes. The second embodiment, like the first, is illustrated in FIGS. 1 to 3, but is based on a table derived by modifying "Huffman Table Number 13" from the Mp3 Audio Standard. The modified table is shown below in Table 6.

TABLE 6

| Symbol | Code Word |
|--------|-----------|
| 1  | 1 |
| 2  | 011 |
| 3  | 0101 |
| 4  | 0100 |
| 5  | 001111 |
| 6  | 001110 |
| 7  | 001101 |
| 8  | 001100 |
| 9  | 0010111 |
| 10 | 0010110 |
| 11 | 0010101 |
| 12 | 0010100 |
| 13 | 0010011 |
| 14 | 00100101 |
| 15 | 00100100 |
| 16 | 00100011 |
| 17 | 00100010 |
| 18 | 0010000 |
| 19 | 00011111 |
| 20 | 000111101 |
| 21 | 000111100 |
| 22 | 000111011 |
| 23 | 000111010 |
| 24 | 000111001 |
| 25 | 000111000 |
| 26 | 00011011 |
| 27 | 00011010 |
| 28 | 000110011 |

TABLE 6-continued

| Symbol | Code Word |
|---|---|
| 29 | 000110010 |
| 30 | 000110001 |
| 31 | 0001100001 |
| 32 | 0001100000 |
| 33 | 000101111 |
| 34 | 000101110 |
| 35 | 000101101 |
| 36 | 000101100 |
| 37 | 000101011 |
| 38 | 000101010 |
| 39 | 00010100 |
| 40 | 0001001111 |
| 41 | 0001001110 |
| 42 | 0001001101 |
| 43 | 0001001100 |
| 44 | 0001001011 |
| 45 | 0001001010 |
| 46 | 0001001001 |
| 47 | 0001001000 |
| 48 | 0001000111 |
| 49 | 0001000110 |
| 50 | 000100010 |
| 51 | 000100001 |
| 52 | 0001000001 |
| 53 | 0001000000 |
| 54 | 000011111 |
| 55 | 000011110 |
| 56 | 000011101 |
| 57 | 00001110011 |
| 58 | 00001110010 |
| 59 | 0000111000 |
| 60 | 0000110111 |
| 61 | 0000110110 |
| 62 | 0000110101 |
| 63 | 0000110100 |
| 64 | 000011001 |
| 65 | 000011000 |
| 66 | 00001011111 |
| 67 | 00001011110 |
| 68 | 00001011101 |
| 69 | 00001011100 |
| 70 | 00001011011 |
| 71 | 00001011010 |
| 72 | 0000101100 |
| 73 | 0000101011 |
| 74 | 00001010101 |
| 75 | 00001010100 |
| 76 | 0000101001 |
| 77 | 0000101000 |
| 78 | 00001001111 |
| 79 | 00001001110 |
| 80 | 00001001101 |
| 81 | 00001001100 |
| 82 | 0000100101 |
| 83 | 00001001001 |
| 84 | 00001001000 |
| 85 | 0000100011 |
| 86 | 00001000101 |
| 87 | 00001000100 |
| 88 | 0000100001 |
| 89 | 0000100000 |
| 90 | 0000011111 |
| 91 | 0000011110 |
| 92 | 00000111011 |
| 93 | 00000111010 |
| 94 | 00000111001 |
| 95 | 00000111000 |
| 96 | 00000110111 |
| 97 | 00000110110 |
| 98 | 00000110101 |
| 99 | 00000110100 |
| 100 | 0000011001 |
| 101 | 0000011000 |
| 102 | 0000010111 |
| 103 | 000001011011 |
| 104 | 000001011010 |
| 105 | 00000101100 |
| 106 | 000001010111 |
| 107 | 000001010110 |
| 108 | 00000101010 |
| 109 | 000001010011 |
| 110 | 000001010010 |
| 111 | 00000101000 |
| 112 | 000001001111 |
| 113 | 000001001110 |
| 114 | 00000100110 |
| 115 | 00000100101 |
| 116 | 000001001001 |
| 117 | 000001001000 |
| 118 | 000001000111 |
| 119 | 000001000110 |
| 120 | 00000100010 |
| 121 | 000001000011 |
| 122 | 000001000010 |
| 123 | 00000100000 |
| 124 | 00000011111 |
| 125 | 000000111101 |
| 126 | 000000111100 |
| 127 | 00000011101 |
| 128 | 00000011100 |
| 129 | 00000011011 |
| 130 | 00000011010 |
| 131 | 000000110011 |
| 132 | 000000110010 |
| 133 | 000000110001 |
| 134 | 000000110000 |
| 135 | 000000101111 |
| 136 | 000000101110 |
| 137 | 000000101101 |
| 138 | 000000101100 |
| 139 | 00000010101 |
| 140 | 000000101001 |
| 141 | 0000001010001 |
| 142 | 0000001010000 |
| 143 | 000000100111 |
| 144 | 0000001001101 |
| 145 | 0000001001100 |
| 146 | 0000001001011 |
| 147 | 0000001001010 |
| 148 | 000000100100 |
| 149 | 000000100011 |
| 150 | 000000100010 |
| 151 | 000000100001 |
| 152 | 0000001000001 |
| 153 | 0000001000000 |
| 154 | 000000011111 |
| 155 | 000000011110 |
| 156 | 0000000111011 |
| 157 | 0000000111010 |
| 158 | 0000000111001 |
| 159 | 0000000111000 |
| 160 | 0000000110111 |
| 161 | 0000000110110 |
| 162 | 0000000110101 |
| 163 | 0000000110100 |
| 164 | 0000000110011 |
| 165 | 0000000110010 |
| 166 | 0000000110001 |
| 167 | 0000000110000 |
| 168 | 000000010111 |
| 169 | 000000010110 |
| 170 | 0000000101011 |
| 171 | 0000000101010 |
| 172 | 000000010100 |
| 173 | 0000000100111 |
| 174 | 0000000100110 |
| 175 | 0000000100101 |
| 176 | 0000000100100 |
| 177 | 0000000100011 |
| 178 | 0000000100010 |
| 179 | 000000010000 |
| 180 | 000000001111 |
| 181 | 000000001110 |
| 182 | 00000000110111 |

TABLE 6-continued

| Symbol | Code Word |
|---|---|
| 183 | 00000000110110 |
| 184 | 0000000011010 |
| 185 | 0000000011001 |
| 186 | 00000000110001 |
| 187 | 00000000110000 |
| 188 | 0000000010111 |
| 189 | 00000000101101 |
| 190 | 00000000101100 |
| 191 | 0000000010101 |
| 192 | 00000000101001 |
| 193 | 00000000101000 |
| 194 | 0000000010011 |
| 195 | 00000000100101 |
| 196 | 00000000100100 |
| 197 | 0000000010001 |
| 198 | 0000000010000 |
| 199 | 00000000011111 |
| 200 | 00000000011110 |
| 201 | 0000000001110 |
| 202 | 00000000011011 |
| 203 | 0000000000110101 |
| 204 | 0000000000110100 |
| 205 | 00000000011001 |
| 206 | 00000000011000 |
| 207 | 00000000010111 |
| 208 | 00000000010110 |
| 209 | 00000000010101 |
| 210 | 00000000010100 |
| 211 | 00000000010011 |
| 212 | 00000000010010 |
| 213 | 00000000010001 |
| 214 | 00000000010000 |
| 215 | 00000000001111 |
| 216 | 000000000011101 |
| 217 | 000000000011100 |
| 218 | 000000000011011 |
| 219 | 000000000011010 |
| 220 | 00000000001100 |
| 221 | 00000000001011 |
| 222 | 0000000000101011 |
| 223 | 0000000000101010 |
| 224 | 000000000010100 |
| 225 | 00000000000100111 |
| 226 | 00000000000100110 |
| 227 | 000000000010010 |
| 228 | 000000000010001 |
| 229 | 000000000010000 |
| 230 | 000000000001111 |
| 231 | 000000000001110 |
| 232 | 000000000001101 |
| 233 | 000000000001100 |
| 234 | 000000000001011 |
| 235 | 000000000001010 |
| 236 | 000000000001001 |
| 237 | 0000000000010001 |
| 238 | 0000000000010000 |
| 239 | 000000000000111 |
| 240 | 000000000000110 |
| 241 | 00000000000010111 |
| 242 | 00000000000010110 |
| 243 | 0000000000001010 |
| 244 | 0000000000001001 |
| 245 | 0000000000001000 |
| 246 | 0000000000000111 |
| 247 | 0000000000000110 |
| 248 | 0000000000000101 |
| 249 | 0000000000000100 |
| 250 | 0000000000000011 |
| 251 | 0000000000000010 |
| 252 | 0000000000000001 |
| 253 | 00000000000000001 |
| 254 | 000000000000000001 |
| 255 | 0000000000000000001 |
| 256 | 0000000000000000000 |

Whereas Huffman Table Number 13 from the Mp3 Audio Standard associates each code word with a number pair, Table 6 above assigns, for simplicity, each code word a respective symbol that is selected from the range of "1" to "256". Also for simplicity, code words with common leading bits have been grouped so that their respective symbols are consecutive. As in Huffman Table Number 13, the maximum length for any code word in Table 6 is 19 bits.

Tables 7 and 8, shown below, are two of a plurality of decoding tables based on Table 6 that are used collectively in the current embodiment to decode code words that require multiple counts, i.e., multiple iterations of the S302 through S310 loop. Only the two tables, 7 and 8, are provided herein, because only tables 7 and 8 are needed in decoding the string in the current example. Table 7 is the main decoding table and Table 8 is a subtable. Table 7 has, in addition, multiple other subtables, and subtables may have their own subtables. For execution speed, all these (sub)tables would preferably reside in memory, and, for compactness, adjacent to one another. Thus, for example, the main table is followed by a subtable, which is followed by its Own subtables, which are followed by a second subtable of the main table, and by the second subtable's subtables, etc.

TABLE 7

Example lookup-table

| Row # | Entry Identifier | Symbol/Offset address | Shift amount/code length |
|---|---|---|---|
| −1 | S | 0x 1 | 1 |
| 0 | | 19 | 1 |
| 1 | B | +20 | 17 |
| 2 | N | T1 | |
| 3 | N | T2 | |
| 4 | N | T3 | |
| 5 | N | T4 | |
| 6 | N | T5 | |
| 7 | N | T6 | |
| 8 | N | T7 | |
| 9 | N | T8 | |
| 10 | N | T9 | |
| 11 | N | T10 | |
| 12 | N | T11 | |
| 13 | B | −24 | 17 |
| 14 | B | +28 | 18 |
| 15 | S | 0x FC | 16 |
| 16 | S | 0x FD | 17 |
| 17 | S | 0x FE | 18 |
| 18 | | 0x FF | 19 |
| 19 | | 0x 100 | 19 |
| 20 | | 0x 4 | 4 |
| 21 | | 0x 3 | 4 |
| 22 | | 0x 2 | 3 |
| 23 | | 0x 2 | 3 |
| 24 | | 0x F6 | 16 |
| 25 | | 0x F7 | 16 |
| 26 | | 0x F8 | 16 |
| 27 | | 0x F9 | 16 |
| 28 | | 0x FA | 16 |
| 29 | | 0x FB | 16 |

TABLE 8

Example lookup-subtable T2

| Row # | Entry Identifier | Symbol/Offset address | Shift amount/code length |
|---|---|---|---|
| −4 | S | 0x 13 | 8 |
| −3 | B | +11 | 18 |
| −2 | B | +7 | 17 |
| −1 | N | T2 1 | |
| 0 | | 6 | 5 |
| 1 | N | T2 2 | |

TABLE 8-continued

Example lookup-subtable T2

| Row # | Entry Identifier | Symbol/Offset address | Shift amount/code length |
|---|---|---|---|
| 2 | B | +13 | 16 |
| 3 | B | +21 | 17 |
| 4 | S | 0x 33 | 10 |
| 5 | S | 0x 34 | 10 |
| 6 | S | 0x 35 | 9 |
| 7 |   | 0x 19 | 9 |
| 8 |   | 0x 18 | 9 |
| 9 |   | 0x 17 | 9 |
| 10 |   | 0x 16 | 9 |
| 11 |   | 0x 15 | 9 |
| 12 |   | 0x 14 | 9 |
| 13 |   | 0x 2f | 10 |
| 14 |   | 0x 2e | 10 |
| 15 |   | 0x 2d | 10 |
| 16 |   | 0x 2c | 10 |
| 17 |   | 0x 2b | 10 |
| 18 |   | 0x 2a | 10 |
| 19 |   | 0x 29 | 10 |
| 20 |   | 0x 28 | 10 |
| 21 |   | 0x 32 | 9 |
| 22 |   | 0x 32 | 9 |
| 23 |   | 0x 31 | 10 |
| 24 |   | 0x 30 | 10 |

Table 7 is a decoding table that, unlike the decoding table, Table 5, of the previous example, has entries with an "Entry Identifier" of "N", each "N" entry pointing to a new decoding table. Row 3 of Table 7, for example, has a "Symbol/offset address" field that points to subtable T2, which appears above as Table 8. Subsequent rows of Table 8 point to other subtables (not shown). Processing branches to a subtable when, in the course of decoding a code word, another count, and thus another iteration of loop S302 through S310, is needed.

It is assumed here that received from the encoded bitstream source 202 is the following bitstream "0001000111 . . . ", where the trailing dots represent bits that follow in the bitstream.

Decoding of the following string 0001000111 proceeds as follows:

1) CURR_GRP=0001000111 . . . (up to 19 bits, which is the search field length in the current embodiment, because Table 6 has a maximum code length of 19 bits).

2) ACC_VALLE=3 (referring to FIG. 3, steps S302 and S304), because the high order string consists of 3 bits, i.e., "000". ACC_VALUE is validated against ZEROS_MAX or ONES_MAX, depending on whether ACC_VALUE is positive or negative, respectively. Since ACC_VALUE is, in this example, positive-valued, ZEROS_MAX is used for validation. ZEROS_MAX and ONES_MAX normally are set equal to the positive branch amount and the negative branch amount, respectively, as is the case in the current example, and as was the case in the previous example. The positive branch amount is the set equal to the largest zero bit count needed during decoding. Because the symbol "255" in Table 7 consists of 19 zeros, the positive branch amount is set to 19, as it appears in row 0. Accordingly, ZEROS MAX=19.

Since ZEROS MAX is 19, and ACC_VALUE is 3, ACC_VALUE=<ZEROS_MAX; therefore, ACC_VALUE is within bounds.

3) The current Table 7 position is TABLE_STARTING_ADDRESS (row 0). An offset of ACC_VALUE=3 into Table 7 is made from the current position, to arrive at row 3. The contents of row 3 are then retrieved. Symbolically, *(TABLE_STARTING_ADDRESS+ACC_VALUE) is:

| N | T2 |
|---|---| and the host 208 copies this entry into the retrieval register and the work register.

4) The host 208 checks the Entry Identifier by shifting the work register and determines the Identifier to be N, implying that a branch is to occur to a new table that is located at TABLE_STARTING_ADDRESS+ OFFSET. Since the Identifier is N, another iteration is needed (step S308).

5) The host 208 shifts the Entry Identifier field away in the retrieval register, leaving the second field which contains the value "T2". This second field is of the third type noted earlier, i.e. it contains an offset from TABLE_STARTING_ADDRESS to a new table, subtable T2, which is Table 8. (It is noted that rows −1 and 1 in Table 8 contain "T2_1" and "T2$_{13}$2", respectively, in the "Symbol/offset address" field. "T2_X" is the address of a subtable of subtable T2, i.e., the address of a subtable of Table 8.)

6) Update TABLE_STARTING_ADDRESS=TABLE_STARTING_ADDRESS+T2, after saving TABLE_STARTING_ADDRESS to ADDRESS_SAVE if TABLE_STARTING_ADDRESS is not already stored for quick retrieval, for example, as a declared parameter of the program executed by the host processor 208. Now, TABLE_STARTING_ADDRESS points to Table 8, which is created for code words starting with "0001", the leading code word bits that have already been used to invoke Table 8.

7) TEMP (which, like CURR_GRP, is 19 bits long in this embodiment) is loaded with CURR_GRP and is shifted left by |ACC_VALUE|+1 bits. The already known 4 bits arc thereby shifted away.

8) The remaining bits in TEMP="000111" now comprise CURR_GRP (step S312) which is inputted to the accelerator 216.

9) ACC_VALUE=3 (steps S302 and S304), due to the high order bit run of length 3.

10) The host 208 retrieves *(TABLE_STARTING_ADDRESS),

| 0 | 6 | 5 |
|---|---|---| which now corresponds to the row 0 entry of Table 8. The host 208 now has the positive branch count for comparison with ACC_VALUE.

11) ACC_VALUE is within bounds (since the positive branch count here is 6).

12) The host 208 reads *(TABLE_STARTING_ADDRESS+ACC_VALUE), finding:

| | | |
|---|---|---|
| B | +21 | 17 | and the host 208 copies this entry into the retrieval register and the work register.

13) The host 208 shifts the work register to identify this entry as a "B" entry. For a "B" entry, another iteration is not needed (step S308), and the current coded word has not yet been decoded (step S312). The host 208 determines bits 4 through 13 (i.e. the Symbol/offset address field, represented by OFFSET) by shifting the retrieval register, after detecting the value in "Shift amount/code length" in the retrieval register.

14) The host 208 copies CURR_GRP, i.e. the contents of the code word register, to TEMP and shifts TEMP left by |ACC_VALUE|+1 bits. TEMP now contains the bit string "11 . . . ." Right shifting TEMP by 17 bits, which is the number of bits specified in "Shift amount/code length" in the present example, right justifies the bit string "11" in TEMP. The value of string "11", in this final iteration, serves as a predetermined tail offset into Table 8.

15) The host 208 reads *(TABLE_STARTING_ADDRESS+OFFSET+(TEMP after right-shifting by SHIFT as specified in step 14 above)), i.e., the contents or row (0+21+3=24) and finds entry

| | | |
|---|---|---|
| 0x30 | | 10 | and the host 208 copies this entry into the retrieval register (step S314).

16) The host 208 extracts CL_LEN=10 from the 4 least significant bits.

17) The host shifts the entry right by 4 bits and receives output symbol, which is the value "30" in hexadecimal, or 48 in decimal. As is seen from Table 6, the output symbol "48" corresponds, as expected, to the code word decoded in this example "0001000111".

18) CURR_GRP is left-shifted by CL_LEN (step S316). Additional new bits, if any currently exist in the reception buffer 206, fill the code word register up to the search field length of 19 bits.

19) Restore TABLE_STARTING_ADDRESS from ADDRESS_SAVE.

20) Decoding continues if the code stream is not done (step S318).

It is noted that if any of the code words that start with a particular bit sequence require use of a subtable, then all such code words will require that subtable during decoding. The code word "0001100", for example, is decoded by determining a count of 3 for the leading substring "000", ignoring the next bit, and using the final three bits, "100" as a tail offset, provided that the tail threshold is at least 3. Without more information, in this scenario, one would design the main decoding table so that the count of 3 offsets into the table to point to a "B" entry, thereby allowing the tail offset to be used; thus, the output symbol is found, and no subtable is needed. If, however, another code word that starts with "001" requires a subtable, the leading string "001" would lead to the "B" entry, rather than the required "N" entry which references the needed subtable. An example is "00101100". This code word begins with the substring "001", which entails one bit run count, but the code word requires a subtable for each subsequent bit run count.

The solution is to design the main decoding table so that the leading substring "001" points to an "N" entry, rather than to a "B" entry, and construct the branched to subtable to handle processing at that point. Consequently, a leading substring "001" for any code word causes the processing to point to an "N" entry in the main decoding table.

During the decoding of Huffman code words, the positive and negative branch counts are repeatedly used to validate bit run counts, but are fixed for a particular decoding table. At the start of decoding, they therefore are preferably stored for fast access, such as in special CPU registers, so that the overhead of repeatedly retrieving them from the table is avoided.

The positive and negative branch counts can be limited to some length other that the maximum number of consecutive zero or one bits, respectively, that are needed for a count. For example, instead of looking at 19 bits, merely the first 16 bits are examined. The table entry at TABLE_STARTING_ADDRESS+(ZEROS_MAX or ONES_MAX), in that case, contains a pointer to a new table that deals with the remaining bits of code words that are longer than 16 bits. To keep decoding time to a minimum, however, a majority of the bit runs to be counted should fit into the decoder window, which is 16 bits in the first embodiment and 19 bits in the second embodiment.

The length of the tail threshold is a design question. In the first decoding example, the length is two bits. Using one bit would not have saved memory, but would have required more recursive steps, and therefore longer decoding time, although one bit may be beneficial for other decoding tables. While increasing the tail threshold to three would not have been of benefit in the first embodiment, since all subtrees there have a maximum remaining code word length of two bits (after processing zero/one strings), different thresholds such as 3 or 4 could be used for more complex tables such as those employed in the JPEG or MPEG standard, and, for example, a tail threshold of 3 was used for the second embodiment. More bits affords a quicker search, but may result in decoding tables having several redundant memory locations. For example, three remaining bits (for a tail threshold of 3) require 8 memory locations, although it may be the case that only three of the locations are occupied by code words.

Field sizes in the decoding tables presented here are variable, so that, if longer decoding table rows are needed, the relative lengths of the fields can be adjusted or a longer word length can be used. A Symbol/offset address field size of 10 bits can address 1024 memory locations in RAM 224, which is quite sufficient for either the first or second embodiment. In the second embodiment, for example, Table 6 contains 256 symbols, whereas even at only 50% efficiency, there are merely 512 different memory locations that need to be referenced. In the first embodiment, Table 4 has only 32 symbols, and is easily accommodated by 10-bit memory addresses.

The Shift amount/code length field is 4 bits long in the first embodiment, allowing for the handling of code words of up to 16 bits in length; whereas, the second embodiment uses a 5-bit long Shift amount/code length field, since the maximum code word length in bits is 19, which is representable by 5 bits. The resulting total entry length in the decoding tables is 17 bits—2 bits for the Entry Identifier field, 10 bits for the Symbol/offset address field and 5 bits for the Shift amount/code length field. Alternatively, the total entry length can be made 16 bits, by eliminating one bit from the Symbol/offset address field and correspondingly reducing RAM memory 224 by making some subtables nonresident and swappable into memory.

The lookup table(s) can be fixed for a particular Huffman tree. Alternatively, they can (generated "on the fly" at the start of decoding based on a Huffman tree leading in the encoded bitstream, or updated as needed, as, for example, to accommodate an adaptive Huffman coding scheme.

Although the embodiments shown have decoding tables with "B" entries and use tail offsets, the scope of the invention does not require that a decoding table have "B" entries or that tail offsets be used. A decoding table may have, for example, merely "S" and "N" entries—the "S" entry contains a decoded output symbol, whereas the "N" entry points to a subsequent decoding table. In operation, each bit run in a current code word results in a respective count, from which the host processor 208 determines a respective offset into the current table. At that offset, a respective "N" entry points to a respective subsequent table, and the process repeats for the next bit run, until, based on the final bit run, the host processor 208 offsets into the current table to arrive at an "S" entry, which contains the decoding result.

The invention is preferably implemented with an accelerator 216 to assist in difficult bit manipulation functions, such as finding the length of a zero/one string, bit shifting and comparison which are difficult for the CPU to perform. For example, as discussed above, finding the first "1" in a stream is difficult using software, but is easily handled through hardware.

Figure 4:
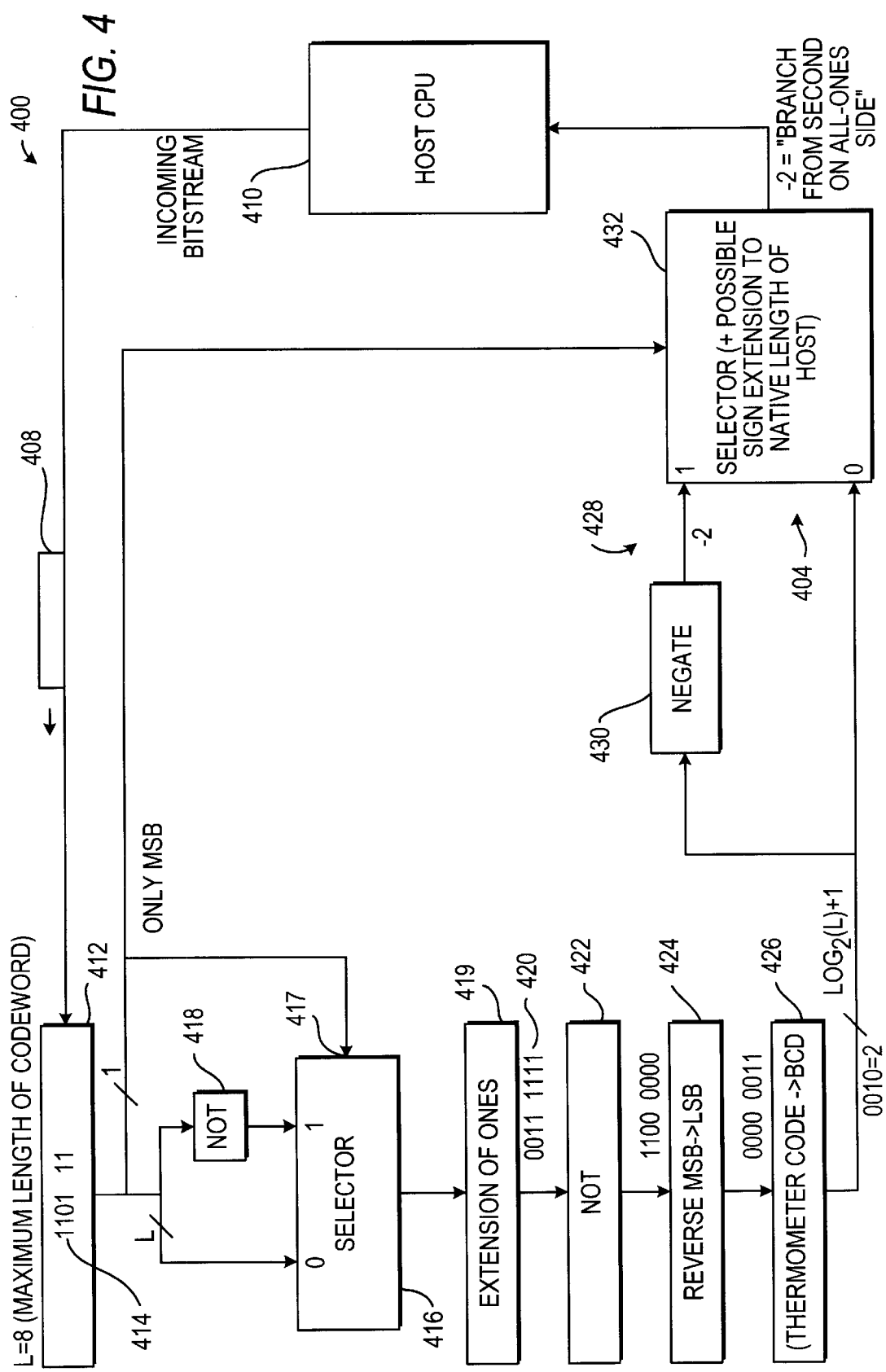
FIG. 4 is a diagram of a component of the decoding system in FIG. 2 in accordance with the present invention.

FIG. 4 illustrates in a Huffman decoding apparatus 400 one possible implementation of a leading zero/one count calculator or accelerator 404 in accordance with the present invention. Operation is explained here for a 8-bit search window: the bits to be detected are given to the accelerator 404 as part of a current group 408 of bits by the host CPU 410 in a register 412. The first bit to be searched is in the MSB end of the register. The MSB or leading bit 414 of the incoming bit slice is examined by a selector 416 having a value detector 417 to determine if processing is headed towards an "all-zeros" or "all-ones" path. If a pre-selected bit value, e.g., one, is detected as the MSB 414, a first inverter 418 bitwise inverts the output of the register 412; otherwise, if zero is the MSB 414, no inversion occurs. In either case, a selector 416 passes on the result to a digit extender such as one extender 419 which converts to the pre-selected value, here one, every other-valued bit of significance lower than that of the most significant bit having the pre-selected value in the digit extended output 420. A second inverter 422 inverts the output 420.

This second inverted result is reversed by a reversor 424 so that bit $x_L$ is swapped with $x_0$, $x_{L-1}$ with $x_1$ and so forth, where $x_L$ is the most significant bit and $x_0$ is the least significant bit. This reversed result, i.e., reversed string, is directed to a thermometer code evaluator 426 which does thermometer to binary coded digit conversion, thereby determining the length of the all-zeros/ones run. A thermometer code is a bit string that has all same-valued bits at one end, the number of the same-valued bits indicating the value of the code, i.e., a thermometer code having four trailing ones has a value of four. If it is detected by the value detector 417 that the leading bit 414 has the pre-selected value, the output of the thermometer code evaluator 426 is negated by a run characterizer 428 that includes a negator 430 and a selector 432. The run characterizer 428 thus selectively reformats the output of the thermometer code evaluator, including the step of sign extending that output to the native length of the host CPU 410 if such extending is needed by the host CPU 410.

The final result is a BCD number that gives the length of the all-ones/zeros run at the start of the current group 408, that is, a current count for the group 408. The final result is negative if the leading bit 414 is one and positive if the leading bit 414 is zero.

An example of hardware that may be used for the accelerator 404 appears below (A 16-bit search field is used, since 16 bits is a common native word length of CPU's).

1) 16-bit register 412 to store data to be searched;
2) 16 NOT gates to invert the data, if inversion is needed;
3) 32-to-16 selector 416;
4) Hardware to extend the first detected one to the right;
5) 16 NOT gates to invert this result;
6) Hardware to reverse 16 bits;
7) Thermometer to BCD converter (1 6-to-4 BCD encoder);
8) BCD to negative two's complement converter (negator 430);
9) 32-to-16 selector (selector 432) for selecting either a direct or two's complement negated result; and
10) Output buffer register, 16 bits.

The "negative for ones, positive for zeros" convention is not essential. The information could be passed in some other form to the CPU. In the above embodiments, the format of the accelerator output provides both the current count and the basis for selecting either ONES_MAX or ZEROS_MAX for comparison to ACC_VALUE. Several other methods exist, however, such as delivering all-ones information in the MSB end of the result and all-zeros in the LSB end, which saves the need for .BCD to two's complement conversion and the corresponding need for the thermometer code evaluator 426.

In an alternative embodiment, the interface to the host could be performed via registers that the host already has, if the accelerator 404 is permitted entry to the core of the host 410.

Although the above embodiments have been described with respect to Huffman-encoded code words, the scope of the invention includes other variable length code words.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A method for decoding a code word in a series of variable length code words comprising the steps of:
   a) detecting the value of a bit in said code word;
   b) calculating a current count that starts with said bit and includes, from said series of variable length code words, subsequent, consecutive bits of the same value;

c) based on the current count, retrieving an entry from a decoding table; and d) based on the retrieved entry, determining whether steps a) through d) are to be repeated for said code word using bits subsequent to those included in the one or more counts in step b).

2. The method of claim 1, wherein, if it is determined in step d) that steps a) through d) are not to be repeated, step d) further comprises determining whether the entry last retrieved contains an output symbol that constitutes a decoding of said code word, and, if not, retrieving, based on at least one bit subsequent to those counted in step b), from a decoding table an entry that contains an output symbol that constitutes a decoding of said code word.

3. The method of claim 1, wherein step d) further includes the step of detecting whether the retrieved entry contains a symbol found indicator, and wherein said detection of said symbol found indicator indicates that steps a) through d) are not to be repeated for said code word.

4. The method of claim 1, wherein step d) further includes the step of detecting whether the retrieved entry contains a branching indicator, and wherein said detection of said branching indicator indicates that steps a) through d) are not to be repeated for said code word.

5. The method of claim 4, further comprising, if said branching indicator has been detected, the step of:

e) retrieving, based on at least one bit subsequent to those counted in step b), from a decoding table an entry that contains an output symbol that constitutes a decoding of said code word.

6. The method of claim 5, wherein, for step e), said at least one bit belong to said code word and consist of a number that is no more than a predetermined threshold.

7. The method of claim 1, wherein said method is operable to decode a code word for which the detected bit values of respective iterations are not all the same.

8. The method of claim 1, wherein the retrieving in step (c) is from a different decoding table from one iteration to the next.

9. The method of claim 1, wherein the counted bits are separated iteration-to-iteration by a single bit in said series of code words.

10. The method of claim 1, wherein said series of variable length code words is received by a mobile terminal and decoded by said method.

11. The method of claim 10, wherein said mobile terminal is a mobile telephone.

12. The method of claim 1, wherein said variable length code words are Huffman-encoded code words.

13. A variable length decoding apparatus configured to decode a code word in serially arranged, variable length code words, comprising:

a leading zero/one count calculator for detecting the value of a bit in said code word and calculating a current count that starts with said bit and includes, from said series of variable length code words, subsequent, consecutive bits of the same value; and a control block configured for retrieving, based on the current count, an entry from a decoding table, and, based on the retrieved entry, determining whether to repeat, using bits subsequent to those counted by the calculator, the steps of invoking the calculator and performing said retrieving and determining for said code word.

14. The apparatus of claim 13, the control block being further configured so that if the control block determines that the invoking, retrieving and determining steps are not to be repeated for said code word using bits subsequent to those counted by the calculator, the control block further determines whether the entry last retrieved contains an output symbol that constitutes a decoding of said code word, and, if not, retrieves, based on at least one bit subsequent to those counted by the calculator, from a decoding table an entry that contains an output symbol that constitutes a decoding of said code word.

15. The apparatus of claim 14, wherein said at least one bit belong to said code word and consist of a number of bits that is no more than a predetermined threshold.

16. The apparatus of claim 15, wherein said apparatus is operable so that said detected bit values of respective iterations are generally not all the same.

17. The apparatus of claim 13, wherein said apparatus is configured so that said detected bit values of respective iterations are generally not all the same.

18. The apparatus of claim 13, wherein said iterative retrievals retrieve from a different decoding table from one iteration to the next.

19. The apparatus of claim 13, further comprising a mobile terminal for receiving from the control block the decoding of said code word.

20. The apparatus of claim 19, wherein said mobile terminal comprises a mobile telephone.

21. The apparatus of claim 13, wherein said variable length code words are Huffman-encoded code words.

22. An apparatus for determining the value of the leading bit of a string and a count of a run that includes said bit comprising:

a value detector for detecting said value;

a first inverter for inverting the bits of said string if said detected value is equal to a pre-selected bit value;

a digit extender for converting to said pre-selected bit value every bit of said string of value different than said pre-selected bit value and of significance lower than that of the most significant bit having said pre-selected bit value;

a second inverter for inverting bits output from said digit extender;

a reversor for reversing the order of said bits inverted by said second inverter to create a reversed string; and a thermometer code evaluator for calculating a run count of the bits in said reversed string that have said pre-selected value.

23. The apparatus of claim 22, further comprising:

means for selecting said string from serially-arranged, variable length code words; and means for using said calculated run count and detected value to decode a current one of a said code words.

24. The apparatus of claim 23, wherein said variable length code words are Huffman-encoded code words.

25. The apparatus of claim 22, further comprising a run characterizer for assembling a digital representation of said calculated run count and said detected value.

26. The apparatus of claim 25, wherein said digital representation comprises a binary coded decimal representation of said calculated count.

27. A computer-readable medium of instructions for decoding a code word in serially-arranged variable length code words comprising:

a) detecting means for detecting the value of a bit in said code word;

b) calculating means for calculating a current count that starts with said bit and includes, from said series of variable length code words, subsequent, consecutive bits of the same value;

c) retrieving means for retrieving, based on the current count, an entry from a decoding table; and d) determining means for determining, based on the retrieved entry, whether means a) through d) are to be re-invoked for said code word using bits subsequent to those counted by the calculating means.

28. The medium of claim 27, wherein the determining means further determines whether the entry last retrieved contains a decoding of said current code word, said medium also including:

e) second retrieving means for retrieving, based on at least one bit subsequent to those counted by the calculating means, from a decoding table an entry that contains a decoding of said current code word, if the determining means has determined that a decoding of said current code word has not already been retrieved.

29. A method for determining the value of the leading bit of a string and a count of a run that includes said bit comprising:

detecting said value;

inverting the bits of said string if said detected value is equal to a pre-selected bit value;

converting to said pre-selected bit value every bit of said string of value different than said pre-selected bit value and of significance lower than that of the most significant bit having said pre-selected bit value;

inverting the string after said conversion;

reversing the order of said bits inverted after conversion, to create a reversed string; and calculating a run count of the bits in said reversed string that have said pre-selected value.

30. The method of claim 1, further including, if step d) determines that steps a) through d) are to be repeated for said code word, the step of repeating steps a) through d) for said code word using bits subsequent to those included in the one or more counts in step b).

* * * * *